United States Patent
Mitra et al.

[11] Patent Number: 5,850,150
[45] Date of Patent: Dec. 15, 1998

[54] FINAL STAGE CLOCK BUFFER IN A CLOCK DISTRIBUTION NETWORK

[75] Inventors: Sundari S. Mitra, Milipitas; Prasad H. Chalasani, Sunnyvale; Marc Elliot Levitt, Sunnydale, all of Calif.

[73] Assignee: Sun Microsystems, Inc., Palo Alto, Calif.

[21] Appl. No.: 640,660

[22] Filed: May 1, 1996

[51] Int. Cl.$^6$ .................................. H03K 19/096
[52] U.S. Cl. .................. 326/16; 326/93; 327/297
[58] Field of Search .................. 326/93, 95, 98, 326/16; 327/295, 296; 395/555, 556; 371/22.1, 22.5

[56] References Cited

U.S. PATENT DOCUMENTS

| | | | |
|---|---|---|---|
| 5,109,353 | 4/1992 | Sample et al. | 364/578 |
| 5,220,217 | 6/1993 | Scarrá et al. | 327/296 |
| 5,235,521 | 8/1993 | Johnson et al. | 364/489 |
| 5,396,129 | 3/1995 | Tabira | 326/93 |
| 5,481,209 | 1/1996 | Lim et al. | 326/93 |
| 5,489,857 | 2/1996 | Agrawal et al. | 326/40 |
| 5,497,109 | 3/1996 | Honda et al. | 326/93 |
| 5,570,045 | 10/1996 | Erdal et al. | 326/93 |
| 5,586,307 | 12/1996 | Wong et al. | 395/551 |

OTHER PUBLICATIONS

Wakerly, John F.; "Digital Design: Principles and Practices", copyright Sep. 1989 by John F. Wakerly;pp. 274–275.

*Primary Examiner*—Edward P. Westin
*Assistant Examiner*—Benjamin D. Driscoll
*Attorney, Agent, or Firm*—Skjerven, Morrill, MacPherson, Franklin, Friel LLP; Forrest E. Gunnison

[57] ABSTRACT

A final stage clock buffer for use in a clock distribution network in a circuit with scan design includes a demultiplexer circuit and a control circuit. The buffer receives an input clock signal and outputs a clock signal and a scan clock signal. The buffer can operate in a functional mode, a scan mode and a hold mode. The demultiplexer circuit receives the input clock signal and a scan enable signal. The scan enable signal, when asserted, causes the buffer to enter the scan mode. In the scan mode, the demultiplexer circuit propagates the input clock signal to a scan clock terminal and a constant logic level to a clock terminal. When the scan enable signal is deasserted, the demultiplexer circuit propagates the input clock signal to the clock terminal and a constant logic level to the scan clock terminal. The control circuit receives a chip-enable signal. When the chip-enable signal is asserted while the scan signal is deasserted, the buffer enters the functional mode. The asserted chip-enable signal causes the control circuit to allow the input clock signal to continue to propagate to the clock terminal. When both the chip-enable signal and the scan signal are deasserted, the buffer enters the hold mode. The deasserted chip-enable signal causes the control circuit to stop the propagation of the input clock signal to the clock output terminal and, instead, causes the clock signal to remain in a constant logic state.

27 Claims, 6 Drawing Sheets

FINAL STAGE CLOCK BUFFER IN A CLOCK DISTRIBUTION NETWORK

FIELD OF THE INVENTION

The present invention is related to buffers and, more particularly, to clock buffers for use as the final stage buffer in a clock distribution network.

BACKGROUND

Large integrated circuits typically have a multi-level clock distribution network for providing clock signals to the clocked logic elements of the circuit. In general, these clock distribution networks use several levels of buffers to distribute the clock signals to the clocked logic elements. Final stage buffers are the buffers in the clock distribution network that are connected to the clocked logic elements.

In addition, these large integrated circuits can include test circuitry to test the functionality of the integrated circuit. In one test approach, known as scan design, predetermined data sequences (i.e., scan-in data) are scanned into various internal registers of the integrated circuit using a scan clock signal. Accordingly, in scan design, a scan clock signal and a normal clock signal are routed to the registers. The integrated circuit is then allowed to operate for one or more clock cycles, and the resulting data (i.e., scan-out data) in the internal registers is scanned out and compared to the expected data. A fault is indicated when the scanned output data and the expected data do not match. The integrated circuit can be controlled to operate in a functional mode (i.e., normal operation) and a scan mode for testing.

However, the test circuitry needed to implement the scan design occupies area on the integrated circuit, which significantly increases the cost of the integrated circuit compared to a design without the scan design capability. Further, in relatively complex integrated circuits such as, for example, a microprocessor, the scan design circuitry may occupy a significant portion of the total integrated circuit area. As a result, the integrated circuit may be impractical to manufacture with full scan design (i.e., substantially all internal registers being scannable) using conventional scan design schemes. Moreover, some conventional scan design schemes impact the timing of the functional circuitry due to the increased number of interconnects required and the addition of circuitry in the integrated circuit's functional data paths.

For example, FIG. 1 shows a block diagram of part of the final level of clock buffering in a conventional clock distribution network for an integrated circuit with scan design. This part of the final level of clock buffering includes a flip-flop 100, which is connected to a final level buffer 120 and a scan clock buffer 130. The flip-flop 100 includes, for use in the functional mode, an input lead 101 for receiving a clock signal ck from the buffer 120 and an input lead 103 for receiving a data signal d for storage in the flip-flop 100. For use in the scan mode, the flip-flop 100 includes an input lead 105 for receiving a scan clock signal sclk from the scan clock buffer 130 and an input lead 107 for receiving the scan-in signal si. The flip-flop 100 includes an input lead 109 for receiving a scan enable signal se to select between the functional mode and the scan mode. When the scan enable signal se causes the flip-flop 100 to be in the functional mode, the flip-flop 100 provides an output signal q at an output lead 111. Conversely, when the scan enable signal se causes the flip-flop 100 to be in the scan mode, the flip-flop 100 provides a scan-out signal so at an output lead 113.

Typically, the flip-flop 100 includes a multiplexer (not shown) that receives the scan enable signal se at a control terminal, causing the multiplexer to select either the data signal d or the scan-in signal si. Consequently, in a large integrated circuit containing several thousand flip-flops in the scan design, a total amount of area used to implement the multiplexers in the flip-flops becomes significant. In addition, this conventional scheme requires that the scan enable signal se be routed to every flip-flop, further increasing the area occupied by the scan circuitry. Still further, the multiplexer in each flip-flop adds delay in the functional path of the flip-flop, which generally is undesirable in an integrated circuit.

SUMMARY

In accordance with the present invention, a buffer includes a demultiplexer circuit and a control circuit. In one embodiment for use as a final level clock buffer in a clock distribution network in a circuit with scan design, the buffer receives an input clock signal and outputs a clock signal and a scan clock signal. The buffer can operate in a functional mode, a scan mode and a hold mode. The demultiplexer circuit receives the input clock signal and a scan enable signal. The scan enable signal, when asserted, causes the buffer to enter the scan mode and output the scan clock signal. More specifically, the asserted scan enable signal controls the demultiplexer circuit to propagate the input clock signal on an output lead coupled to a scan clock output terminal while causing an output lead coupled to a clock output terminal to propagate a constant logic level. In contrast, when the scan enable signal is deasserted, the demultiplexer circuit propagates the input clock signal to the output lead coupled to the clock output terminal while causing the output lead coupled to the scan clock output terminal to propagate a constant logic level.

The control circuit receives a chip-enable signal. When the chip-enable signal is asserted while the scan enable signal is deasserted, the buffer enters the functional mode. More specifically, the deasserted scan enable signal causes the demultiplexer circuit to propagate the input clock signal on an output lead coupled to the clock output terminal as stated above. In addition, the asserted chip-enable signal causes the control circuit to allow the input clock signal to continue to propagate to the clock output terminal.

However, when both the chip-enable signal and the scan enable signal are deasserted, the buffer enters the hold mode. The deasserted chip-enable signal causes the control circuit to stop the propagation of the input clock signal to the clock output terminal and, instead, causes the clock signal to remain in a constant logic state. As a result, the clock signal clocking the flip-flops does not toggle, which prevents the flip-lops from changing states.

This embodiment of a final level clock buffer, when used in conjunction with suitable flip-flops with scan capability, provides many advantages over conventional schemes. For example, because the scan clock enable signal is routed to the final level buffer, scan enable signal lines do not need to be routed to each flip-flop as required in some scan design schemes using conventional clock buffers. Consequently, the area needed to implement the scan design is reduced and signal routing is simplified compared to these conventional scan designs. In addition, because the hold mode prevents the flip-flops from changing states, the chip-enable signal does not need to be routed to each flip-flop. Similarly, the signal routing process is further simplified and the area needed to implement the scan design is further reduced. Because a final level buffer typically drives several flip-flops, in a large integrated circuit, the total reduction in area and signal routing design time is substantial.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
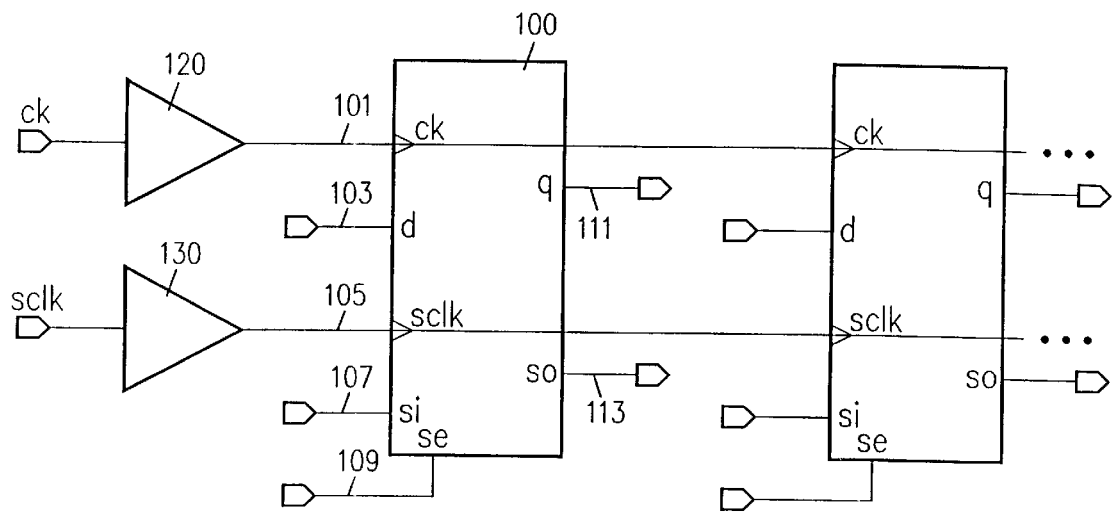
FIG. 1 is a block diagram of a conventional clock buffer and flip-flop for use with scan design.
Figure 2:
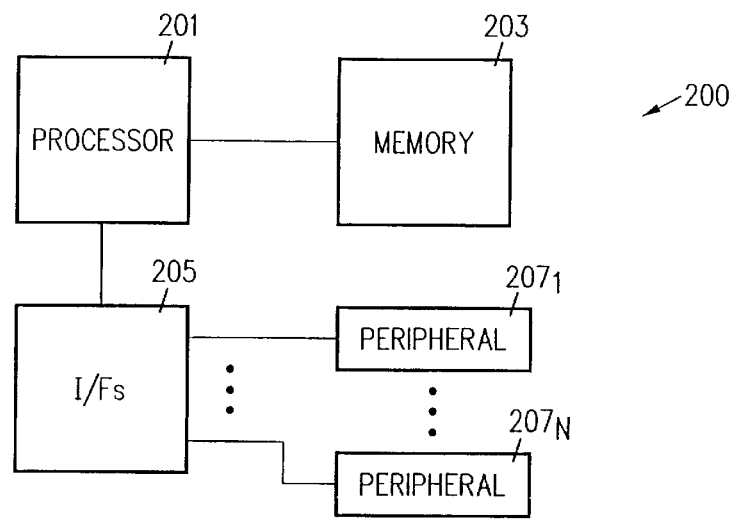
FIG. 2 is a block diagram of an electronic system with an integrated circuit having a clock buffer according to one embodiment of the present invention.

FIG. 2 is a block diagram of an electronic system 200 having an integrated circuit 201 including a clock buffer (described below in conjunction with FIGS. 3–6) according to one embodiment of the present invention. The electronic system 200 can be any type of electronic system. In this embodiment, the electronic system 200 is a computer system in which the integrated circuit 201 is a processor connected to a memory 203 and to interfaces 205. The interfaces 205 are connected to peripherals $207_1$–$207_N$, thereby allowing the processor to interact with these peripherals. The memory 203 and the interfaces 205 can be any type of memory or interface for use in computer systems. Likewise, the peripherals can be any type of peripheral such as, for example, displays, mass storage devices, keyboards or any other type of input or input-output device. The integrated circuit 201 supports scan design circuitry in accordance with the present invention, and can operate in a scan mode (for testing) and a functional mode (i.e., normal operation). More specifically, the integrated circuit 201 includes a clock distribution network having clock buffers in accordance with the present invention to reduce the area and timing impact of the scan design circuitry, compared to other clock distribution networks using conventional clock buffers.

Figure 3:
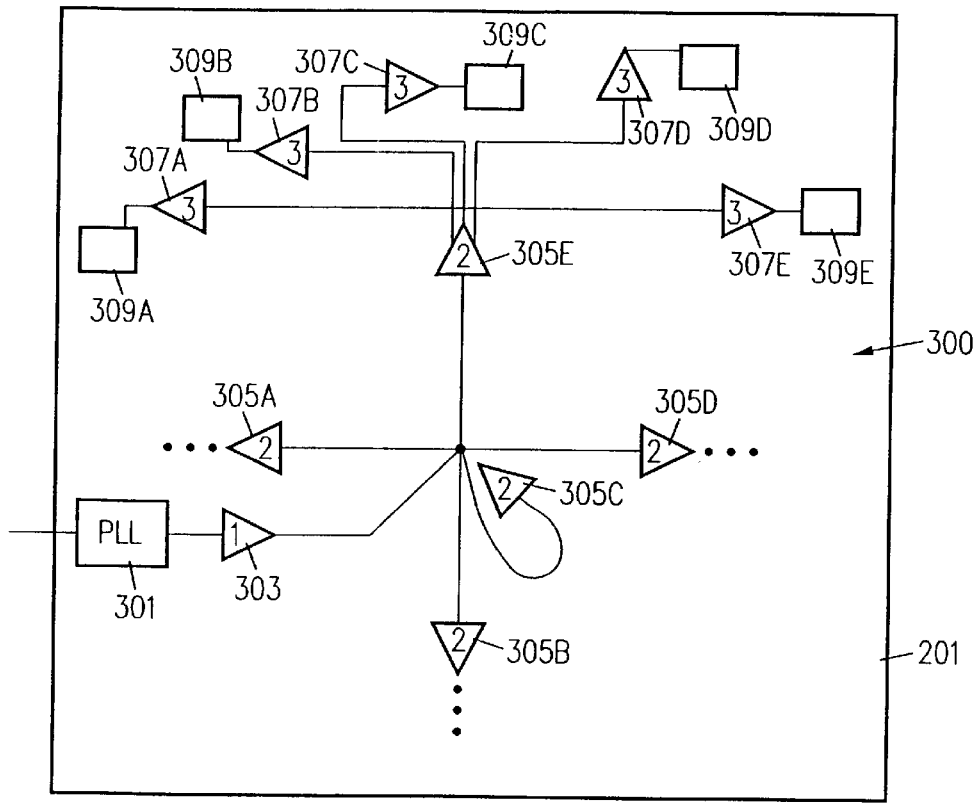
FIG. 3 is a block diagram of the integrated circuit depicted in FIG. 2.

FIG. 3 is a block diagram diagrammatically illustrating a clock distribution network 300 including a buffer according to the present invention, implemented in the integrated circuit 201 (FIG. 2). The clock distribution network 300 includes a phase locked loop (PLL) 301, a first-level buffer 303, second-level buffers 305 A–305E, third-level buffers 307A–307E, and blocks 309A–309E that contain final level buffers according to the present invention.

The PLL 301 is coupled to receive a raw clock signal from an external source (not shown) and has an output lead connected to the input lead of the first-level buffer 303. The output lead of the first-level buffer 303 is connected to the input leads of the second-level buffers 305A–305E, which in turn each have one or more output leads connected to the input leads of one or more third-level buffers. For clarity, only the third level buffers 307A–307E driven by the second-level buffer 305E are shown in FIG. 3. The third-level buffers 307A–307E have output leads connected to the blocks 309A–309E, respectively.

In functional mode operation, the PLL 301 receives the raw clock signal and outputs a clock signal synchronized with the raw clock signal. In addition, the PLL 301 increases the frequency of the output clock signal compared to the raw clock signal. For example, in one embodiment, the PLL 301 outputs a clock signal having a frequency equal to about two times the frequency of the raw clock signal. The clock signal provided by the PLL 301 is then distributed to the blocks 309A–309E through the first-level, second-level and third-level buffers. In this embodiment, each block 309A–309E includes several buffers and flip-flops as described below in conjunction with FIG. 4. The blocks 309A–309E may be implemented as disclosed in co-filed and commonly assigned U.S. patent application Ser. Nos. 08/640,721 entitled "Clock Distribution Network With Modular Buffers", or 08/641,509 entitled "A Reduced Skew Control Block Clock Distribution Network", both by S. Mitra and incorporated herein by reference. Thus, during the functional mode, the PLL 301 provides the clock signal distributed to the clocked elements, which is referred to hereinafter as the clock signal ck.

However, in the scan mode, the PLL 301 is disabled so that the first-level buffer 303 receives the raw clock signal directly. Of course, any suitable circuit or method may be used to provide the raw clock signal to the first-level buffer 303. For example, a multiplexer can be used to route either the raw clock signal or the PLL output clock signal to the first-level buffer 303. The raw clock signal is then distributed to the clocked elements in the integrated circuit through the second-level and third-level buffers as described above for the functional mode. Thus, during the scan mode, the raw clock signal is distributed to the clock elements and is hereinafter referred to as the scan clock signal sclk.

Figure 4:
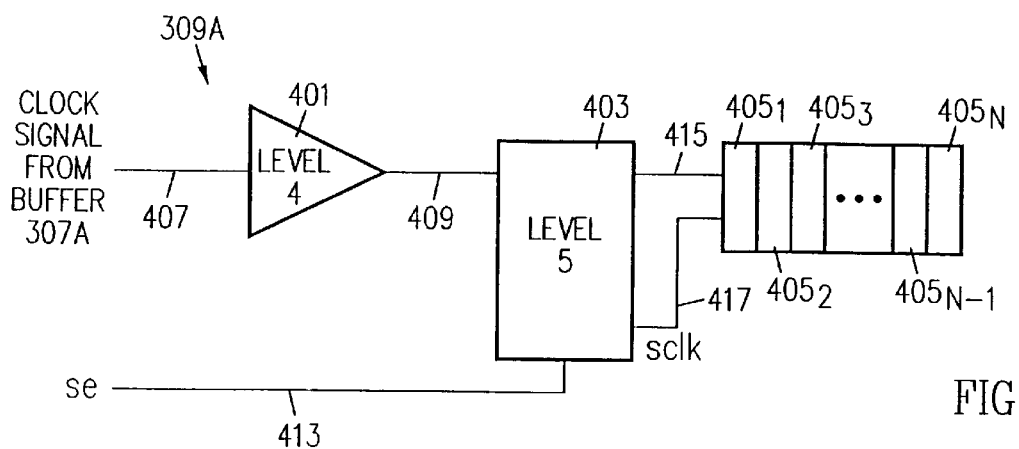
FIG. 4 is a block diagram illustrating part of a block depicted in FIG. 3.

FIG. 4 is a block diagram illustrating part of the block 309A (FIG. 3) according to one embodiment of the present invention. The block 309A includes a fourth-level buffer 401, a fifth-level buffer 403 and several flip-flops $405_1$–$405_N$ (described below in conjunction with FIGS. 5–8). Although not shown in FIG. 4, it is understood that the flip-flops have input leads and output leads that are connected to other circuitry within the integrated circuit 201 (FIG. 3) for inputting and outputting both normal data and scan data.

The fourth level buffer 401 is coupled to receive a clock signal from the third-level buffer 307A (FIG. 3) through a line 407 and distributes this clock signal to the fifth-level buffer 403 through a line 409. Although not shown in FIG. 4, the fourth-level buffer 401 may also distribute the clock signal to other fifth-level buffers in the block 309A. The fourth-level buffer 401 may be implemented with any suitable buffer such as, for example, the fourth-level buffers disclosed in the aforementioned U.S. patent applications Ser. Nos. 08/641,509 and 08/640,721. As described above in FIG. 3, the clock signal distributed by the third-level buffer is the scan clock signal sclk during scan mode and the clock signal ck during the functional mode.

In this embodiment, the fifth-level buffer 403 also is coupled to receive a scan enable signal se from a control circuit (not shown) through a line 413. In response to the logic state of the enable signal se, the fifth-level buffer 403 enters either the functional mode or the scan mode to distribute to the flip-flops $405_1$–$405_N$ either the clock signal ck or the scan clock signal sclk. One embodiment of the flip-flops $405_1$–$405_N$ is disclosed in co-filed and commonly assigned U.S. patent application Ser. No. 08/640,568 entitled "Flip-flop with Full Scan Capability" by S. Mitra, which is incorporated herein by reference. In this embodiment, the fifth-level buffer 403 may drive as many as sixteen flip-flops.

In the functional mode, the fifth-level buffer 403 provides the clock signal ck to the flip-flops $405_1$–$405_N$ over a line 415. Although the line 415 is shown as a single line, the clock signal ck can be a differential signal, with the line 415 representing a pair of signal lines. When providing the clock signal ck, the fifth-level buffer 403 holds the clock signal sclk at a logic high state. Conversely, in the scan mode, the fifth-level buffer 403 provides the scan clock signal sclk to the flip-flops $405_1$–$405_N$ over a line 417 while holding the clock signal ck at a logic high state. Thus, the fifth-level buffer, in effect, includes the multiplexing function for switching between the functional mode and the scan mode. As a result, the flip-flops $405_1$–$405_N$ can be implemented in less area than flip-flops in a conventional scan design, which have multiplexing circuitry. Because each fifth-level buffer can drive up to sixteen flip-flops, the total area required to implement the scan design circuitry can be significantly reduced.

Figure 5:
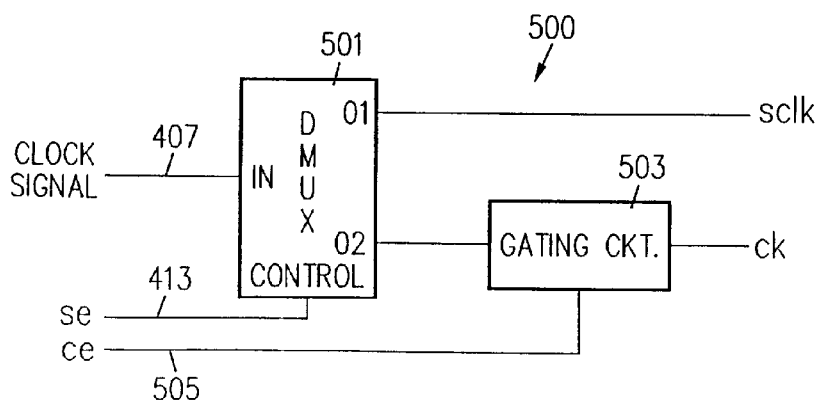
FIG. 5 is a block diagram of another embodiment of a fifth-level buffer according to the present invention.

FIG. 5 is a block diagram of a fifth-level buffer 500 for use with a chip-enable signal ce, in accordance with another embodiment the present invention. The fifth-level buffer 500 includes a one-to-two demultiplexer 501 and a control circuit 503. The control circuit 503 causes the fifth-level buffer 500 to enable and disable the clock signal ck at desired points in a clock cycle, in response to the chip-enable signal ce. The chip-enable signal ce is used to configure the fifth-level buffer 500 in a hold mode.

The fifth-level buffer 500 is similar to the fifth-level buffer 403 (FIG. 4), except that the fifth-level buffer 500 includes an input lead 505 connected to the control circuit 503 for receiving the chip-enable signal ce. Thus, the fifth-level buffer 500 includes the input lead 409 connected to the demultiplexer 501 for receiving the input clock signal from the fourth-level buffer 401 (FIG. 4) and the input lead 413 connected to the control input terminal of the demultiplexer 501 for receiving the scan enable signal se. The fifth-level buffer also includes the output lead 415 connected to one of the output terminals of the demultiplexer 501 for outputting the clock signal ck, and the output lead 417 connected to the other output terminal of the demultiplexer 501 for outputting the scan clock signal sclk.

In this embodiment, with the chip-enable signal ce asserted when the scan enable signal se is deasserted, the fifth-level buffer 500 enters the functional mode and operates as described above for the fifth-level buffer 403 (FIG. 4) in the functional mode. In addition, the chip-enable signal ce has substantially no effect on the fifth-level buffer 500 during the scan mode.

However, when both the chip-enable signal ce and the scan enable signal se are deasserted, the fifth-level buffer 500 enters the hold mode and operates as follows. The deasserted chip-enable signal ce causes control circuit 503 to hold the clock signal ck at a logic high level. Consequently, the fifth-level buffer 500 disables the flip-flops $405_1$–$405_N$ (FIG. 4), as described in the aforementioned patent application Ser. No. 08/640,568. As a result, the flip-flops $405_1$–$405_N$ do not load any new data during the hold mode. Many applications require a way of "holding" or "stalling" data in the flip-flops, which is typically implemented by routing a disable signal to each flip-flop. Because the fifth-level buffers according to this embodiment of the present invention are used to disable the flip-flops, the chip-enable signal need not be routed to each flip-flop, as is required in some conventional scan design circuits. Thus, because an integrated circuit will typically have substantially fewer fifth-level buffers than flip-flops (e.g., in one embodiment, each fifth-level buffer can drive up to sixteen flip-flops), signal line routing is simplified and the area required for scan design circuitry is reduced.

Figure 6A:
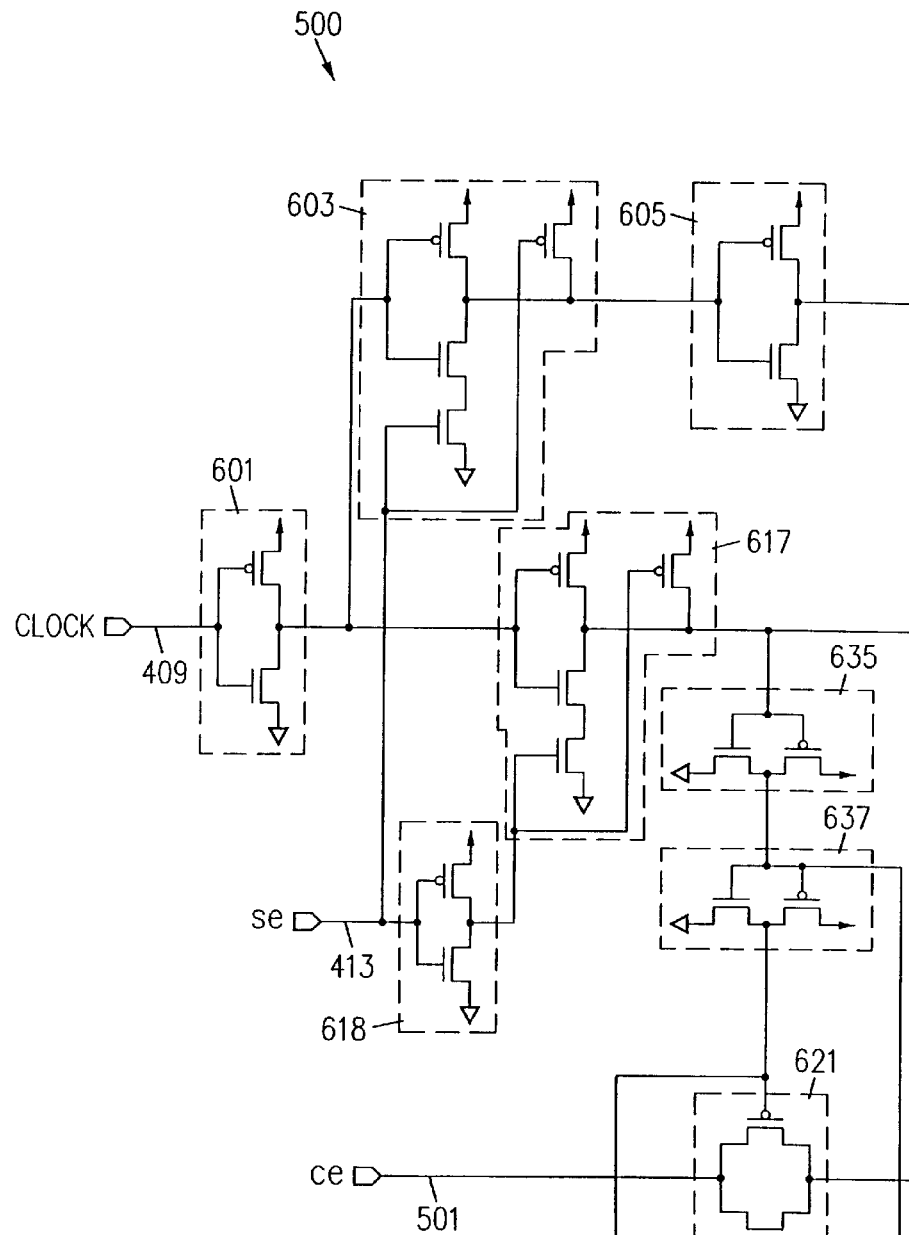
FIG. 6 is a schematic diagram of one embodiment of a fifth-level buffer depicted in FIG. 5, in accordance with the present invention.
Figure 6B:
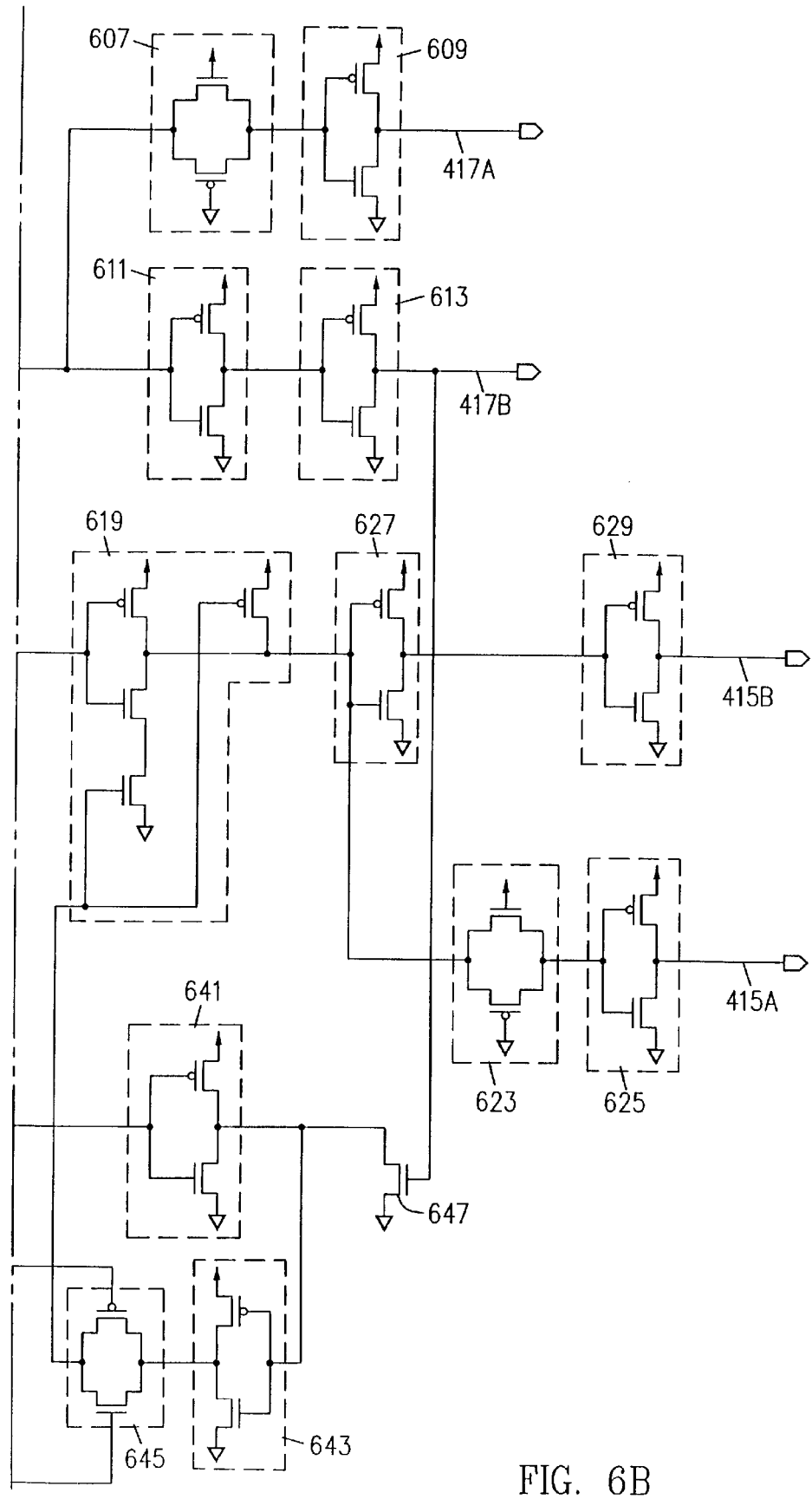

FIG. 6 is a schematic diagram of one embodiment of the fifth-level buffer 500 depicted in FIG. 5, in accordance with the present invention. This embodiment of the fifth-level buffer 500 is implemented in complementary metal-oxide-semiconductor (CMOS) technology and provides differential signals for both the clock signal ck and the scan clock signal sclk.

Scan Clock Path

The input lead 409 of the fifth-level buffer 500 is connected to the input lead of a standard CMOS inverter 601. The output lead of the inverter 601 is connected to one input lead of a standard CMOS two-input NAND gate 603. The other input lead of the NAND gate 603 is connected to the scan enable input lead 413 to receive the scan enable signal se. As a result, when the scan enable signal se is asserted (i.e., at a logic high level), the scan mode is selected and the NAND gate 603 operates as an inverter. The output lead of the NAND gate 603 is connected to the input lead of a standard CMOS inverter 605. Because the clock distribution network is in the scan mode, the scan clock signal is received at the input clock lead 409 and is inverted three times when propagated to the output lead of the inverter 605.

A standard CMOS transmission gate 607 and a standard CMOS inverter 609 are connected in series between the inverter 605 and the output lead of the "true" scan clock output lead 417A. The CMOS transmission gate is hardwired to be conductive. Thus, the scan clock signal is inverted four times when propagated to the "true" scan clock output lead 417A. As a result, the scan clock signal sclk outputted by the fifth-level buffer at the output lead 417 is substantially in-phase with the scan clock signal received at the input lead 409.

In addition, cascaded standard CMOS inverters 611 and 613 are connected in series between the output lead of the inverter 605 and the "complement" scan clock output lead 417B. Thus, the scan clock signal received at the input lead 409 during the scan mode is inverter five times when propagated to the "complement" scan clock output lead 417B. Consequently, the complement scan clock signal sclk_l is substantially 180° out of phase with the scan clock signal received at the input lead 409.

In the functional mode, the scan enable signal se is deasserted (i.e., at a logic low level), thereby causing the NAND gate 603 to output a logic high level. As a result, the scan clock signal sclk is held at a logic level and the "complement" scan clock signal sclk_l is held at a logic low level.

FUNCTIONAL CLOCK PATH

The output lead of the inverter 601 is also connected to one input lead of a standard CMOS two-input NAND gate 617. The other input lead of the NAND gate 617 is coupled to the scan enable input lead 413 through a standard CMOS inverter618. Thus, when the scan enable signal is deasserted, the inverter 618 provides a logic high level to the NAND gate, thereby causing the NAND gate 617 to function like an inverter. The output lead of the NAND gate 617 is connected to one input lead of another standard CMOS two-input NAND gate 619. The other input lead of the NAND gate 619 is connected to receive the chip-enable signal ce through a standard CMOS transmission gate 621. The chip-enable signal is gated by the transmission gate 621 and stored as described below.

When the chip-enable signal ce is asserted, the NAND gate 619 receives the asserted chip-enable signal, which causes the NAND gate 619 to function as an inverter. Consequently, the input clock signal received at the input lead 409 is inverted three times in propagating to the output lead of the NAND gate 619. The output lead of the NAND gate 619 is coupled to the "true" output clock lead 415A through a standard CMOS transmission gate 623 and a CMOS inverter 625, which are connected in series. The CMOS transmission gate 623 is hardwired to be conductive. Thus, the clock signal ck is substantially in-phase with the input clock signal received at the input lead 409. In addition, the output lead of the NAND gate 619 is also coupled to the "complement" clock output lead 415B through cascaded CMOS inverters 627 and 629. Accordingly, the complement clock signal ck_l is substantially 180° out of phase with the input clock signal received at the input lead 409.

When the chip-enable signal ce is deasserted, the NAND gate 619 outputs a logic high level whatever the logic state of the input clock signal. Thus, the clock signal ck is held at a logic low level by the inverter 625 and the complement clock signal ck_l is held at a logic high level.

The input lead of the transmission gate 621 is coupled to receive the chip-enable signal ce. As described above, the output lead of the transmission gate 621 is connected to the NAND gate 619. The gate of the p-channel field effect transistor (FET) of the transmission gate 621 is coupled to the output lead of the NAND gate 617 through cascaded standard CMOS inverters 635 and 637. Thus, in the functional mode, the p-channel FET receives essentially the input clock signal inverted four times. In addition, the gate of the p-channel FET is coupled to the gate of the n-channel FET of the transmission gate 621 through a standard CMOS inverter 639. As a result, the transmission gate 621 is conductive when the input clock signal is at a logic low level and non-conductive when the input clock signal is at a logic high level. Accordingly, if the chip-enable signal ce is asserted during the first half of an input clock signal cycle (i.e., when the input clock signal is at a logic high level), the chip-enable signal ce does not propagate to the NAND gate 619 until the second half of the input clock signal cycle (i.e., when the input clock signal is at a logic low level).

In addition, the output lead of the transmission gate 621 is connected to the input lead of a standard CMOS inverter 641. The output lead of the inverter 641 is connected to the input lead of another standard CMOS inverter 643. The output lead of the inverter 643 is coupled to the input lead of the inverter 641 through a standard CMOS transmission gate 645. The gate of the n-channel FET of the transmission gate 645 is connected to the gate of the p-channel FET of the transmission gate 621, whereas the gate of the p-channel FET of the transmission gate 645 is coupled to the output lead of the NAND gate 617 through the inverter 635. As a result, the transmission gate 645 is controlled to be conductive when the transmission gate 621 is non-conductive and vice versa.

Consequently, when the transmission gate 621 is conductive during the first half of an input clock signal cycle, the logic level of the chip-enable signal ce is propagated to the input lead of the transmission gate 645, which is non-conductive. Then when the input clock signal toggles, the transmission gate 621 becomes non-conductive while the transmission gate 645 becomes conductive, thereby causing the inverters 641 and 643 to form a latch. This latch "latches" the logic level of the chip-enable signal ce being received by the NAND gate 619 for essentially the second half of the input clock signal cycle. The inverters 641 and 643 together with the transmission gates 621 and 645, in effect, form a delay circuit that delays the chip-enable signal by half a clock cycle of the input clock signal received at the input lead 409.

Also, the drain of a n-channel FET 647 is connected to the input lead of the inverter 643. The n-channel FET 647 has its source coupled to a source of ground potential (not shown) and has its gate connected to the complement scan clock output lead 417B. Consequently, in the functional mode, because the complement scan clock signal sclk_l is held at logic low level, the n-channel FET 647 is turned off and does not affect the inverters 641 and 643. However, in the scan mode, the n-channel FET 647 is turned on when the scan clock signal sclk transitions to a logic low level, which causes the inverter 643 to output a logic high level. Thus, during the first clock cycle of a functional mode following a scan mode, the inverter 643 provides a logic high level to the NAND gate 619, thereby helping to ensure the NAND gate 619 will function as an inverter at the start of the functional mode.

Figure 7:
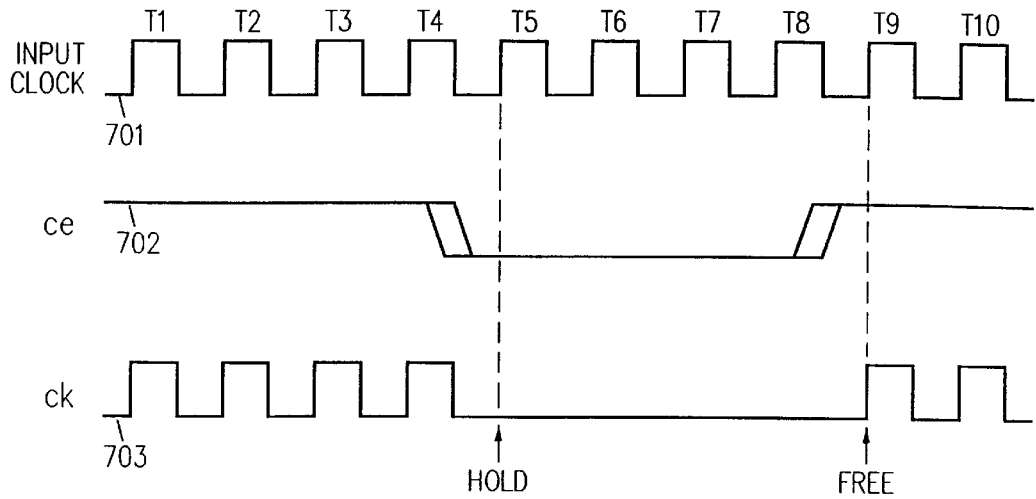
FIGS. 7–9 are timing diagrams illustrating the operation of a fifth-level buffer according to one embodiment of the present invention.

FIG. 7 is timing diagram illustrating the operation of the fifth-level buffer 500 (FIG. 6) in the functional and hold modes. The waveforms 701–703 represent the input clock signal received at the input lead 409 (FIG. 6), the chip-enable signal ce received at the input lead 501 and the clock signal ck output at the output lead 415A, respectively. In this exemplary timing diagram, the clock cycles of the input clock signal received at the input lead 409 are labeled T1–T10.

During the clock cycles T1–T3, the chip-enable signal ce is at a logic high level. Thus, the NAND gate 619 (FIG. 6) functions as an inverter, thereby allowing the input clock signal to propagate through the fifth-level buffer 500. Thus, the clock signal ck is substantially identical to the input clock signal received at the input lead 409.

However, during the first half of the clock cycle T4, the chip-enable signal ce transitions to a logic low level, but the transmission gate 621 (FIG. 6) does not transmit the logic low level to the NAND gate 619 until the second half of the clock cycle T4, when the clock signal ck is already at a logic low level. Thus, at the start of the second half of the clock cycle T4, the deasserted chip-enable signal ce causes the clock signal ck to remain at a logic low level as described above in conjunction with FIG. 6. The logic low level of the deasserted chip-enable signal is also transmitted to the inverter 641 (FIG. 6), which outputs a logic high level to the inverter 643. Thus, in effect, the clock signal ck is disabled on the clock cycle following the deassertion of the chip-enable signal ce.

Then, during the first half of the clock cycle T8, the chip-enable signal ce is asserted. Because the transmission gate 621 becomes conductive during the second half of a clock cycle, the logic high level of the asserted chip-enable signal ce does not reach NAND gate 619 until the second half of the clock cycle T8 while the clock signal received at the other input lead of the NAND gate 619 is at a logic low level. Thus, the clock signal ck remains at a logic low level. Then at the beginning of the clock cycle T9, the clock signal ck follows the clock input signal received at the input lead 409 as previously described. Thus, in effect, the clock signal ck is enabled on the clock cycle following the assertion of the chip-enable signal ce.

Figure 8:
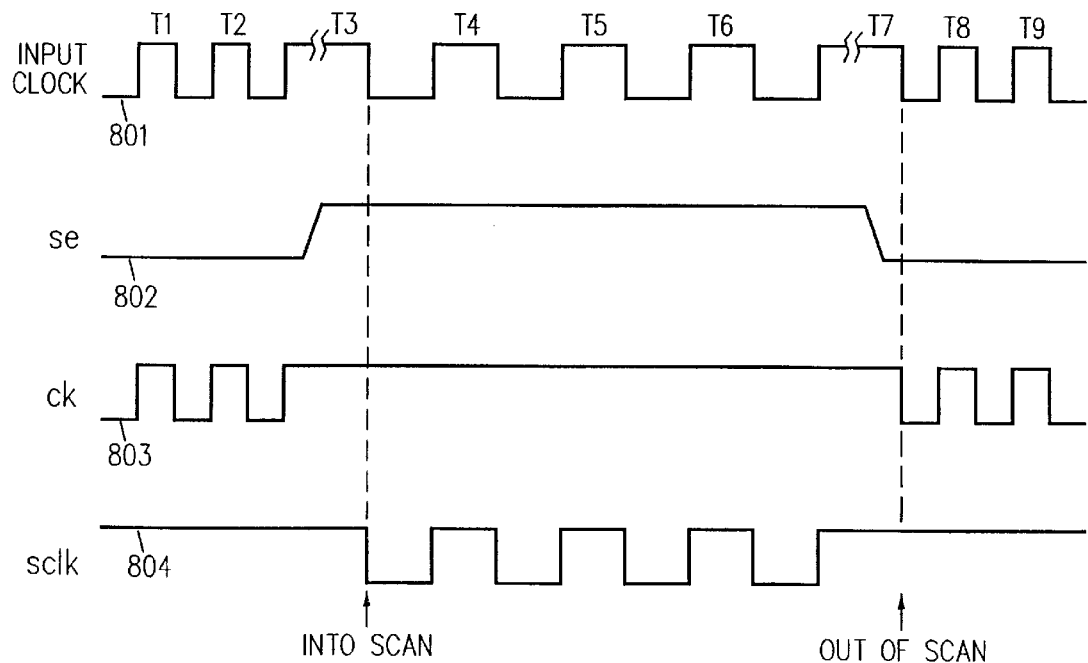

FIG. 8 is timing diagram illustrating the operation of the fifth-level buffer 500 (FIG. 6) in the scan mode with the chip-enable signal asserted. The waveforms 801–804 represent the input clock signal received at the input lead 409 (FIG. 6), the scan enable signal se received at the input lead 413 (FIG. 6), the clock signal ck output at the output lead 415A and the scan clock signal sclk output at the scan clock output lead 417A, respectively. In this exemplary timing diagram, the clock cycles of the input clock signal received at the input lead 409 are labeled T1–T9.

During clock cycles T1 and T2, the scan enable signal se is deasserted and the clock signal ck follows the input clock signal as described above. In addition, the scan clock signal sclk is held at a logic high level as described above in conjunction with FIG. 6. However, at the start of the clock cycle T3, the scan enable signal se is asserted and the input clock signal is switched to have to the desired frequency of the scan clock signal, as described above in conjunction with FIG. 4. Typically, the scan clock frequency is much lower than the normal clock frequency, as illustrated by the waveform 801 during the clock periods T3–T7. The logic high level of the scan enable signal se, through the inverter 618, causes the NAND gate 617 to receive a logic low level at one input lead. Thus, during the clock cycle T3, the NAND gate 617 outputs a logic high level, which cause the clock signal ck to be held at a logic high level as described above in conjunction with FIG. 6. In addition, the NAND gate 603 (FIG. 6) receives the logic high level of the scan enable signal se at one input lead, which causes the NAND gate 603 to function as an inverter, thereby allowing the input clock signal to propagate through the fifth-level buffer 500 and generate the scan clock signal sclk as described above in conjunction with FIG. 6.

Then during the first half of the clock cycle T7, the scan enable signal se is deasserted. As described above, during the first half of the input clock cycle the NAND gate 603 is outputting a logic high level. Consequently, the logic low level of the scan enable signal se causes the scan clock signal sclk to be held at a logic high level. In addition, the logic low level of the scan enable signal se, inverted by the inverter 618, causes the NAND gate 617 to function as an inverter and allow the logic high level of the input clock signal to propagate to the output lead 415A as described above. Thus, on the falling edge of the clock cycle T7, the clock signal ck transitions to a logic low level, following the input clock signal as described above in conjunction with FIGS. 6 and 7. In the next clock cycle T8, the input clock signal is switched to have the frequency desired for the clock signal ck, which is then propagated to the output lead 415A as previously described in conjunction with FIG. 7.

Figure 9:
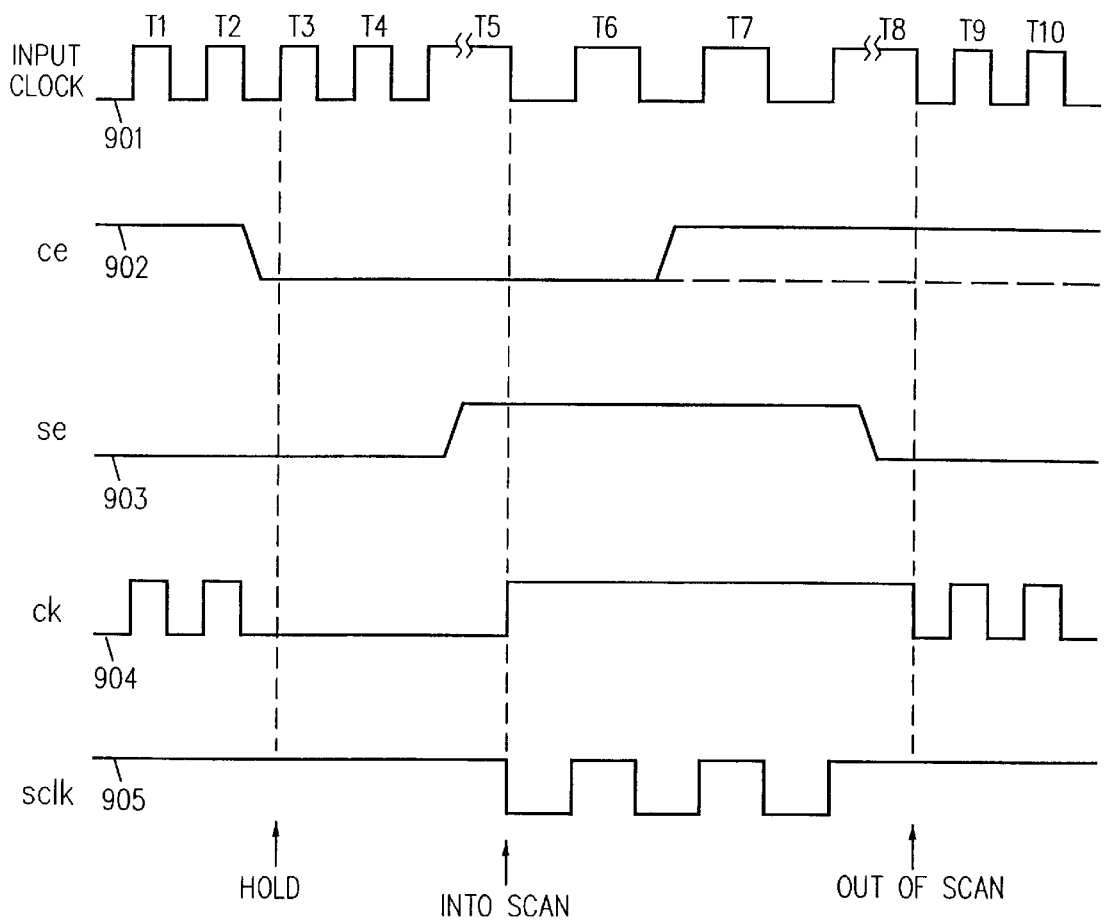

FIG. 9 is timing diagram illustrating the operation of the fifth-level buffer 500 (FIG. 6) in the scan mode with the chip-enable signal deasserted. The waveforms 901–905 represent the input clock signal received at the input lead 409 (FIG. 6), the chip-enable signal ce received at the input lead 501 (FIG. 6), the scan enable signal se received at the input lead 413 (FIG. 6), the clock signal ck output at the output lead 415 A and the scan clock signal sclk output at the scan clock output lead 417A, respectively. In this exemplary timing diagram, the clock cycles of the input clock signal received at the input lead 409 are labeled T1–T10.

During clock cycles T1–T4, the scan enable signal se is deasserted. Accordingly, the fifth-level buffer 500 is in the functional mode and operates as described above in conjunction with FIG. 7. More specifically, the operation of the fifth-level buffer 500 during clock cycles T1–T4 corresponds to clock cycles T3–T6 of FIG. 7. Thus, as shown in FIG. 9, during clock cycles T3 and T4 the clock signal ck is held at a logic low level. In addition, the scan clock signal sclk is held at a logic high level because the logic low level of the scan enable signal se forces the NAND gate 603 (FIG. 6) to output a logic high level, which propagates through the fifth-level buffer 500 to the output lead 417A as previously described.

Then, during the first half of the clock cycle T5, the scan enable signal se is asserted while the chip-enable signal ce remains deasserted. The logic high level of the scan enable signal se causes the NAND gate 603 to function as an inverter while forcing the NAND gate 621 (FIG. 6) to output a logic high level. Consequently, the clock signal ck is held at logic high level and the input clock signal is propagated through the fifth-level buffer 500 to produce the scan clock signal sclk at the output lead 417A., as previously described in conjunction with FIG. 6. As a result, the fifth-level buffer 500 can provide the scan clock to the flip-flops (FIG. 4) while the flip-flops are in "hold", thereby allowing scan out of the "held" data. Further, the logic low level of the complement scan clock signal sclk_l causes the n-channel FET 647 to be turned on, thereby pulling down the voltage at the input lead of the inverter 643. Thus, the inverter 643 outputs a logic high level while the scan enable signal se is asserted, which is propagated to the NAND gate 619 through the conductive transmission gate 645, thereby causing the NAND gate 619 to function as an inverter.

In addition, the logic high level provided by the NAND gate 621 (FIG. 6) causes the transmission gate 621 to be non-conductive while causing the transmission gate 645 (FIG. 6) to be conductive. Consequently, when the chip-enable signal ce is asserted during clock cycle T6, the transmission gate 621 prevents the logic level of the chip-enable signal ce from propagating to the NAND gate 619 during the scan mode.

During the first half of the clock cycle T8, the scan enable signal se is deasserted, thereby causing the scan clock signal sclk to remain at a logic high level and turning off the n-channel FET 647. In addition, the during the first half of the clock cycle T8, the scan enable signal causes the NAND gate 617 to function as an inverter, as previously described. Accordingly, the input clock signal received at the input lead 409 propagates through the fifth-level buffer 500 to generate the clock signal ck as described above. Thus, during the second half of the clock cycle T8 and for clock cycles T9–T10, the clock signal ck follows the input clock signal received at the input lead 409 while the scan clock signal sclk is held at a logic high level.

The embodiments of the buffer described above are illustrative of the principles of this invention and are not intended to limit the invention to the particular embodiments described. For example, transistor technologies other than FETs can be used in other embodiments. Accordingly, while a preferred embodiment of the invention has been illustrated and described, it will be appreciated that in view of this disclosure, various changes can be made therein without departing from the spirit and scope of the invention.

The embodiments of the invention in which an exclusive property or privilege is claimed are defined as follows:

1. A clock signal buffer circuit comprising:
   a first input terminal configured to receive a clock input signal;
   a second input terminal configured to receive a select signal;

a third input terminal configured to receive an enable signal;

a first output terminal;

a second output terminal;

a demultiplexer circuit having a first output lead coupled to said first output terminal, a second output lead coupled to said second output terminal, a first input lead coupled to said first input terminal and a second input lead coupled to said second input terminal, wherein said demultiplexer circuit is operative to provide a clock output signal dependent on said clock input signal to said first output lead in response to said select signal being in a first state and to provide a scan output signal to said second output lead in response to said select signal being in a second state; and a control circuit coupled to said demultiplexer and having a control input lead coupled to said third input terminal and an output lead coupled to said first output terminal, wherein, in response to said enable signal being in a first state, said control circuit is operative to provide to said output lead of said control circuit an output signal dependent on said clock output signal of said demultiplexer circuit.

2. The buffer circuit of claim 1 wherein, in response to said select signal being in said first state, said demultiplexer circuit is operative to cause said scan clock output signal on said second output lead of said demultiplexer circuit to be in a substantially constant state.

3. The buffer circuit of claim 1 wherein, in response to said select signal being in said second state, said demultiplexer circuit is operative to cause said clock output signal on said first output lead of said demultiplexer circuit to be in a substantially constant state.

4. The buffer circuit of claim 1 wherein, in response to said enable signal being in a second state, said control circuit is operative to cause said output signal on said output lead of said control circuit to be in a substantially constant first state.

5. The buffer circuit of claim 4 wherein said first output lead of said demultiplexer circuit is coupled to said first output terminal through said control circuit.

6. The buffer circuit of claim 5 wherein, in response to said select signal being in said second state, said control circuit is operative to cause said output signal on said output lead of said control circuit to be in a substantially constant second state.

7. The buffer circuit of claim 6 wherein, in response to said signal being in said second state and said enable signal being in said second state, said control circuit is operative to cause said output signal on said output lead of said control circuit to be in said substantially constant second state.

8. The buffer circuit of claim 7 further comprising a differential driver circuit coupled to said output lead of said control circuit, said differential driver circuit coupling said output lead of said control circuit to said first output terminal.

9. The buffer circuit of claim 1 further comprising a differential driver circuit coupled to said second output lead of said demultiplexer circuit, said differential driver circuit coupling said second output lead of said demultiplexer circuit to said second output terminal.

10. A clock signal buffer circuit having first, second and third modes of operation, said buffer circuit comprising:

a first input terminal configured to receive a clock input signal, a second input terminal configured to receive a select signal;

a third input terminal configured to receive an enable signal;

a first output terminal;

a second output terminal;

a demultiplexer circuit having a first output lead coupled to said first output terminal, a second output lead coupled to said second output terminal, a first input lead coupled to said first input terminal and a second input lead coupled to said second input terminal; and a control circuit coupled to said demultiplexer and having a control input lead coupled to said third input terminal and an output lead coupled to said first output terminal, wherein said buffer circuit is configured to provide a clock output signal at said first output terminal and a scan clock output signal at said second output terminal, said buffer circuit being selectably configured into said first, second and third modes in response to said enable and select signals, and wherein (a) in said first mode, said clock signal is dependent on said clock input signal, (b) in said second mode, said scan clock output signal is dependent on said clock output signal, and (c) in said third mode, said clock output signal is held in a substantially constant state and said scan clock output signal is held at a substantially constant state.

11. The buffer circuit of claim 10 wherein said buffer circuit is configured into said second state when said second input is in a first state.

12. The buffer circuit of claim 10 wherein said buffer is configured into said first mode when said select signal is in a second state and said enable signal is in a first state.

13. The buffer circuit of claim 10 wherein said buffer is configured into said third mode when said select signal is in said second state and said enable signal is in a second state.

14. The buffer circuit of claim 10 wherein said demultiplexer circuit comprises:

a first NAND gate having a first input lead coupled to said first input terminal and having a second input lead coupled to receive said select signal; and a second NAND gate having a first input lead coupled to said first input terminal and having a second input lead coupled to receive a complement of said select signal.

15. A computer system comprising: a memory; an interface capable of interacting with a peripheral device; and a circuit coupled to said memory and said interface, said circuit including a clock signal buffer circuit having first, second and third modes of operation, said buffer circuit comprising:

a first input terminal configured to receive a clock input signal;

a second input terminal configured to receive a select signal;

a third input terminal configured to receive a enable signal;

a first output terminal;

a second output terminal;

a demultiplexer circuit having a first output lead coupled to said first output terminal, a second output lead coupled to said second output terminal, a first input lead coupled to said first input terminal and a second input lead coupled to said second input terminal; and a control circuit coupled to said demultiplexer and having a control input lead coupled to said third input terminal and an output lead coupled to said first output terminal, wherein said buffer circuit provides a clock output signal at said first output terminal and a scan clock output signal at said second output terminal, said buffer circuit being selectable configured into said first, second and third modes in response to said enable and select signals, and wherein, (a) in said first mode, said clock output signal is dependent on said clock input signal, (b) in said second mode, said scan clock output signal is dependent on said clock output signal, and (c) in said third mode, said clock output signal is held in a substantially constant state and said scan clock output signal is held at a substantially constant state.

16. The computer system of claim 15 wherein said buffer circuit is configured into said second state when said second input is in a first state.

17. The computer system of claim 15 wherein said buffer circuit is configured into said first mode when said select signal is in a second state and said enable signal is in a first state.

18. The computer system of claim 15 wherein said buffer circuit is configured into said third mode when said select signal is in said second state and said enable signal is in a second state.

19. A computer system comprising: a memory; an interface capable of interacting with a peripheral device; and a circuit coupled to said memory and said interface, said circuit including a buffer circuit comprising:

a first input terminal configured to receive a clock input signal;

a second input terminal configured to receive a select signal;

a third input terminal configured to receive a enable signal;

a first output terminal;

a second output terminal;

a demultiplexer circuit having a first output lead coupled to said first output terminal, a second output lead coupled to said second output, terminal, a first input lead coupled to said first input terminal and a second input lead coupled to said second input terminal, wherein said demultiplexer circuit is operative to provide a clock output signal dependent on said clock input signal to said first output lead in response to said select signal being in a first state and to provide a scan clock output signal to said second output lead in response to said signal being in a second state; and a control circuit coupled to said demultiplexer and having a control input lead coupled to said third input terminal and an output lead coupled to said first output terminal, wherein, in response to said enable signal being in a first state, said control circuit is operative to provide to said output lead of said control circuit an output signal dependent on said clock output signal of said demultiplexer circuit.

20. The computer system of claim 19 wherein, in response to said select signal being in said first state, said demultiplexer circuit is operative to cause said scan clock output signal on said second output lead of said demultiplexer circuit to be in a substantially constant state.

21. The computer system of claim 19 wherein, in response to said select signal being in said second state, said demultiplexer circuit is operative to cause said clock output signal on said first output lead of said demultiplexer circuit to be in a substantially constant state.

22. The computer system of claim 19 wherein, in response to said enable signal being in a second state, said control circuit is operative to cause said output signal on said output lead of said control circuit to be in a substantially constant first state.

23. The computer system of claim 22 wherein said first output lead of said demultiplexer circuit is coupled to said first output terminal through said control circuit.

24. The computer system of claim 23 wherein, in response to said select signal being in said second state, said control circuit is operative to cause said output signal on said output lead of said control circuit to be in a substantially constant second state.

25. The computer system of claim 24 wherein, in response to said select signal being in said second state and said enable signal being in said second state, said control circuit is operative to cause said output signal on said output lead of said control circuit to be in said substantially constant second state.

26. The computer system of claim 25 further comprising a differential driver circuit coupled to said output lead of said control circuit, said differential driver circuit coupling said output lead of said control circuit to said first output terminal.

27. The computer system of claim 19 further comprising a differential driver circuit coupled to said output lead of said demultiplexer circuit, said differential driver circuit coupling said second output lead of said demultiplexer circuit to said second output terminal.

* * * * *

UNITED STATES PATENT AND TRADEMARK OFFICE
CERTIFICATE OF CORRECTION

PATENT NO. : 5,850,150
DATED : December 15, 1998
INVENTOR(S) : Sundari S. Mitra, Prasad H. Chalasani, Marc E. Levitt It is certified that error appears in the above-identified patent and that said Letters Patent is hereby corrected as shown below:

Column 11, claim 1,
Line 13, insert -- clock -- after "scan";

Column 11, claim 7,
Line 48, delete "said signal" and replace with -- said select signal --;

Column 12, claim 10,
Line 19, delete "clock signal" and replace with -- clock output signal --;

Column 13, claim 19,
Line 44, line delete "said signal" and replace with -- said select signal --;

Signed and Sealed this

Twenty-fifth Day of December, 2001

Attest:

Attesting Officer

JAMES E. ROGAN
Director of the United States Patent and Trademark Office